United States Patent [19]

Suzuki

[11] 4,062,033
[45] Dec. 6, 1977

[54] SCHOTTKY BARRIER TYPE SEMICONDUCTOR DEVICE

[75] Inventor: Kunizo Suzuki, Tokyo, Japan

[73] Assignee: Sony Corporation, Tokyo, Japan

[21] Appl. No.: 675,630

[22] Filed: Apr. 9, 1976

[30] Foreign Application Priority Data

Apr. 25, 1975 Japan .................................. 50-50435

[51] Int. Cl.² .................... H01L 29/48; H01L 29/34; H01L 29/40

[52] U.S. Cl. ....................................... 357/15; 357/52; 357/53; 357/91

[58] Field of Search ........................ 357/15, 53, 52, 91

[56] References Cited

U.S. PATENT DOCUMENTS 3,586,542  6/1971  MacRae ................................ 357/15

3,977,019  8/1976  Matsushita et al. .................... 357/91

FOREIGN PATENT DOCUMENTS

300,472  4/1968  Sweden .................................. 35/53

Primary Examiner—Edward J. Wojciechowicz
Attorney, Agent, or Firm—Hill, Gross, Simpson, Van Santen, Steadman, Chiara & Simpson

[57] ABSTRACT

A Schottky barrier is formed between a semiconductor substrate and a metal contact and stabilized by a polycrystalline silicon layer containing oxygen in the range between 2 and 45 atomic percent and surrounding a peripheral portion of the metal contact to improve the breakdown voltage characteristics of the device. The invention is applicable to Schottky barrier type diodes, bipolar transistors, field effect transistors and so on.

5 Claims, 11 Drawing Figures

SCHOTTKY BARRIER TYPE SEMICONDUCTOR DEVICE

BACKGROUND OF THE INVENTION

1. Field of the Invention

The present invention relates mainly to a Schottky barrier type semiconductor device such as a Schottky barrier diode, Schottky barrier collector type transistor, Schottky barrier gate type field effect transistor and the like, and particularly to a Schottky barrier type semiconductor device whose breakdown voltage characteristics are improved.

2. Prior Art of the Invention

Figure 1:
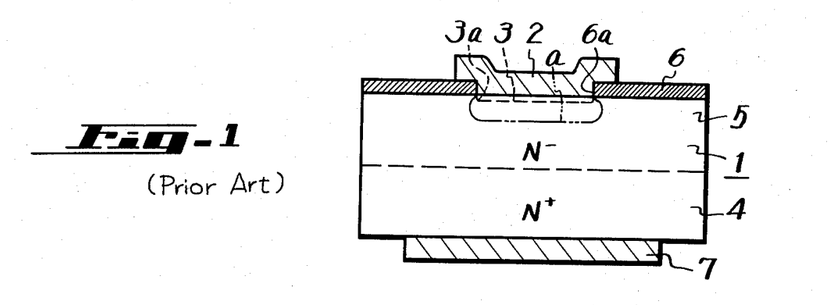
FIGS. 1 to 3 are enlarged cross-sectional views respectively showing a prior art Schottky barrier diode.

In a prior art Schottky barrier diode, as shown in FIG. 1 an N-type silicon semiconductor substrate 1 of, for example, low impurity concentration is normally deposited thereon with a metal contact 2 composed of a metal capable of forming a Schottky barrier therewith, for example, aluminum, thus a Schottky barrier 3 being formed. In this illustrated example, the semiconductor substrate 1 is composed of an N-type original substrate 4 having high impurity concentration and an N-type semiconductor layer 5 having relatively low impurity concentration which is formed on the original substrate 4 by epitaxial growth process. On the semiconductor layer 5 is deposited the metal contact 2 to form the Schottky barrier 3 therewith. In the Schottky barrier diode constructed as mentioned above, an insulating layer 6 made of silicon dioxide ($SiO_2$) is deposited on the surface of the substrate 1 as a protecting layer for surface passivation. The insulating layer 6 is provided with a window 6a through which the metal contact 2 is selectively deposited on the semiconductor layer 5 and also the peripheral edge 3a of the Schottky barrier 3 is covered by the insulating layer 6. Reference numeral 7 denotes an electrode deposited on the original substrate 4 in an ohmic contact therewith, that is, a cathode electrode in the illustrated example.

With the construction as mentioned above, however, there is a defect that the breakdown voltage (inverse voltage) of the Schottky barrier 3 is relatively low because of great field concentration at the peripheral edge 3a of the Schottky barrier 3. Particularly, when the insulating layer 6 made of $SiO_2$ is formed as the protecting layer for surface passivation as mentioned above, a distortion caused by great difference of thermal expansivity between the above silicon dioxide $SiO_2$ and, for example, silicon Si in the substrate 1 or semiconductor layer 5 is concentrated to the inner peripheral edge of the discontinuous portion of the insulating layer 6 or the window 6a, that is, to the peripheral edge 3a of the Schottky barrier 3. Therefore, when the barrier 3 is applied with an inverse voltage, a depletion layer expanding therefrom into the substrate 1 becomes narrow at the peripheral edge 3a of the barrier 3 as shown by a chain line a in FIG. 1 to cause therein the field concentration with the result that the breakdown is apt to occur at the aforesaid edge portion.

Figure 2:
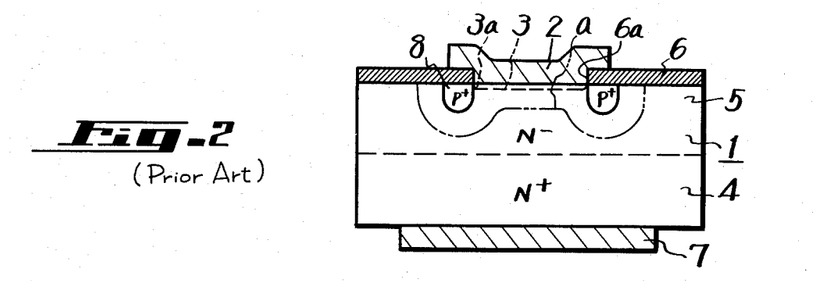

In the Schottky barrier diode as mentioned above, it has been proposed to prevent the breakdown at the peripheral edge 3a of its Schottky barrier 3. That is, as shown in FIG. 2 an annular P-type region 8 of different conductivity type from that of the substrate 1, that is, a so-called guard-ring is formed along the peripheral edge 3a of the Schottky barrier 3 so that a depletion layer may expand outside the region 8 as shown by a chain line a, thus the effect due to the distortion at the inner peripheral edge portion of the window 6a of the insulating layer 6 is avoided.

Figure 3:
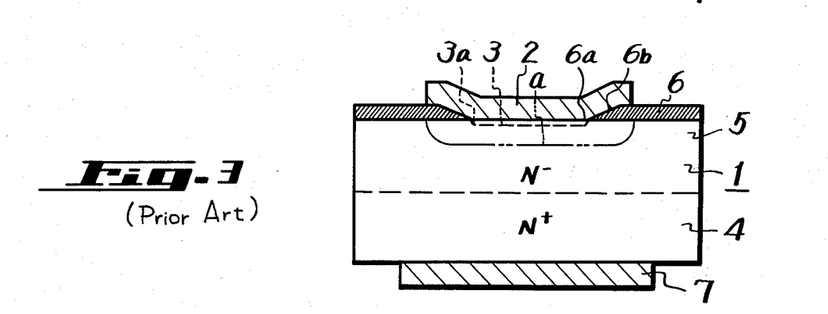

Further, it has been proposed that as shown in FIG. 3 a tapered portion 6b is provided at the peripheral edge of the window 6a of the insulating layer 6 and the depletion layer at the peripheral edge 3a of the barrier 3 is expanded as shown by a chain line a according to the field effect caused by a voltage applied to the metal contact 2.

However, a work of providing the guarding region 8 or providing the tapered portion 6b at the peripheral edge of the window 6a of the insulating layer 6 is troublesome. Further, when the region 8 is provided, the total area becomes large.

Meanwhile, when a silicon dioxide layer as described above is formed on the surface of a semiconductor substrate as the insulating layer for passivation, a positive electric charge, for example, natrium ion $Na^+$ is contained therein to cause a memory operation so that the surface of the semiconductor substrate becomes unstable. In addition, when the substrate is of P-type by way of example, an N channel is produced therein to cause the decrease in breakdown voltage. Further, when a resin mold is applied on a semiconductor pellet, the polarization of resin is sometimes affected on the semiconductor surface through the silicon dioxide layer.

In order to avoid the afore-mentioned drawbacks, it is considered to form a polycrystalline silicon layer doped with no impurity on the surface of the silicon semiconductor substrate. In this case, the above described drawbacks including the memory operation are improved, but another defects are caused such that resistivity is relatively low and hence leak current is increased, emitter-grounded current amplification factor $h_{FE}$ is low and noise is large.

SUMMARY OF THE INVENTION

It is an object of this invention to provide an improved Schottky barrier type semiconductor device which is simple in construction and easy in fabrication.

It is another object of this invention to provide a Schottky barrier type semiconductor device in which depending on a fact that an oxygen-doped polycrystalline silicon exhibits sufficiently high resistance but also exhibits different electrical and mechanical characteristics from those of silicon dioxide $SiO_2$ and polycrystalline silicon doped with no oxygen, the above oxygen-doped polycrystalline silicon is used as a high resistive layer for passivation on the surface of a semiconductor substrate and also the breakdown voltage of the Schottky barrier is enhanced due to the particular feature of the aforesaid polycrystalline silicon.

It is a further another object of this invention to provide a Schottky barrier type semiconductor device with its area being reduced.

The other objects, features and advantages of this invention will be apparent from the following description taken in conjunction with the accompanying drawings.

DESCRIPTION OF THE PREFERRED EMBODIMENTS

Figure 4:
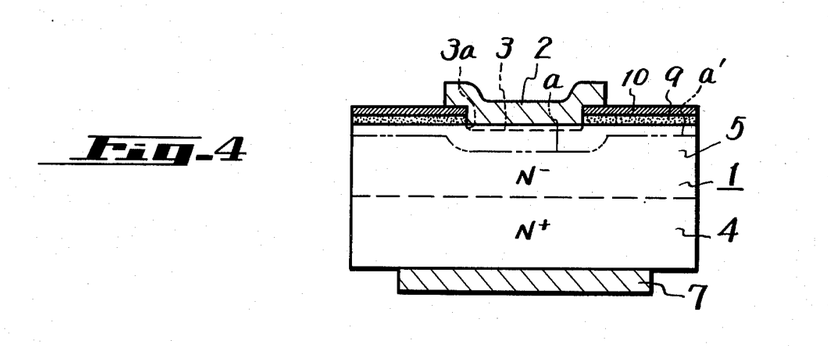
FIG. 4 is an enlarged cross-sectional view showing one example of a device of this invention.

A description will hereinafter be given on one example of this invention applied to a Schottky barrier diode with reference to FIG. 4, in which elements corresponding to those of FIGS. 1 to 3 are marked by same reference numerals with their description being omitted for the sake of brevity.

In place of the silicon dioxide insulating layer 6 described in FIGS. 1 to 3, a polycrystalline (the polycrystal cited in this invention also includes the range called as amorphism) silicon layer 9 particularly doped with oxygen or containing oxygen is deposited on the surface of a semiconductor substrate 1 made of silicon having a predetermined impurity concentration as a protecting layer for passivation at a thickness in the range between 1000 Angstrom (A) and 1 micron ($\mu$), for example, 5000 A. On this polycrystalline silicon layer 9, if necessary, there is deposited an insulating layer made of silicon dioxide $SiO_2$ or silicon nitride $Si_3N_4$ or a similar polycrystalline silicon layer 10 doped with nitrogen N at a thickness of, for example, 1500 A with the purpose of compensating for wet-proof property of the polycrystalline silicon layer 9 or electric resistance thereof in its thickness direction.

In the above oxygen-doped polycrystalline silicon layer 9, the doping amount of oxygen is selected as 2 to 45 atomic percent (%), desirably as 14 to 35 atomic % and most desirably as 20 atomic %.

Figure 5:
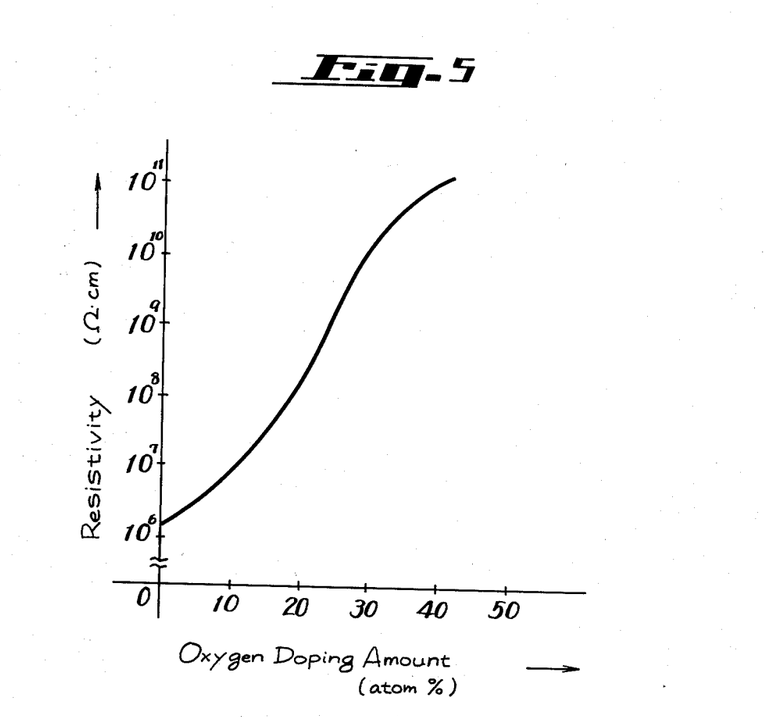
FIG. 5 is a graph showing a measured curve of resistivity with respect to oxygen doping amount in a polycrystalline layer, which is used for explaining this invention.

The relation between oxygen doping amount in atomic % and resistivity in ohm-centimeter ($\Omega.cm$) in the polycrystalline silicon is shown in FIG. 5. As will be apparent from this measured curve, the electric resistance becomes extremely large according to the increase of oxygen doping amount. The curve of FIG. 5 is obtained by the measurement in a polycrystalline silicon with the average grain size in a range between 200 and 300 A.

As described above, if the oxygen doping amount is increased, the resistance of the polycrystalline silicon layer is increased resulting in the reduction of leak current which is desirably required as the protecting layer for passivation. On the other hand, if the oxygen doping amount becomes large, its property approaches that of $SiO_2$ to cause the previously mentioned drawback of passivation due to $SiO_2$. As a result of various kinds of experimental consideration, it was found and ascertained that the selection of the oxygen doping amount in a range between 2 and 45 atomic % and desirably in a range between 14 and 35 atomic % is suitable as the protecting layer for passivation and that an effect of preventing the breakdown of a Schottky barrier, which will be described later, can be obtained. Further, the above polycrystalline layer is preferred to have resistivity in a range between $10^7$ and $10^{11} \Omega.cm$. A substance having resistivity in the above range can be called as a semi-insulator.

The oxygen-doped polycrystalline silicon layer 9 selects its average grain size in a range between 50 A and 1000 A due to the following reason. That is, if it is less than 50 A, its characteristics approach those of a silicon dioxide layer to cause the aforesaid memory effect, and even in a case of its practical fabrication, a reaction temperature is required to be lowered in the chemical vapor deposition method (hereinafter referred to as CVD method) to be described later so that the growth rate of the polycrystalline silicon layer becomes quite slow to cause an industrial disadvantage. Meanwhile, if it is higher than 1000 A, the grain size becomes too great and hence the leak current is increased.

The nitrogen-doped polycrystalline silicon layer 10 deposited on the oxygen-doped polycrystalline silicon layer 9 selects its nitrogen doping amount more than 10 atomic % and is apt to exhibit a property resembled to that of a silicon nitride ($Si_3N_4$) layer. In a practical case, the above silicon layer 10 is easily doped with nitrogen in the amount enough for showing the nature of $Si_3N_4$. Further, there is no trouble even with such a layer as mentioned above but the layer having the nature of $Si_3N_4$ can rather be satisfied.

Referring back to FIG. 4, the oxygen-doped and nitrogen-doped polycrystalline silicon layers 9 and 10 thus formed on the substrate 1 are bored with a window in such a manner that the nitrogen-doped polycrystalline silicon layer 10 is first subjected to chemical etching with phosphoric acid or plasma etching by, for example, photo-etching process and then the oxygen-doped polycrystalline silicon layer 9 is subjected to selective etching with a mixture of fluoric acid, acetic acid and nitric acid, by way of example.

A metal contact 2 such as aluminum which can form a Schottky barrier with the silicon semiconductor layer 5 is deposited on the surface of the substrate 1 or the semiconductor layer 5 exposed through the window of the layers 10 and 9 and a Schottky barrier 3 is selectively formed under the window. The metal contact 2 is also provided partially extending onto the insulating layer 10.

Figure 6:
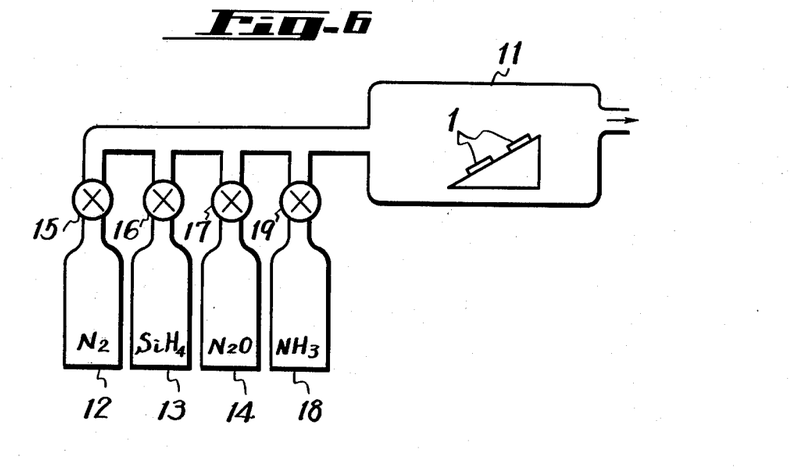
FIG. 6 is a shematic view used for explaining the fabricating operation of a polycrystalline silicon layer used for explaining this invention.

A method of forming a silicon layer doped with oxygen or nitrogen will next be described. In this case, a heating reaction furnace 11 is provided as shown in FIG. 6.

At first, a method of forming the oxygen-doped polycrystalline silicon layer 9 will be described. The reaction furnace 11 is connected with a carrier gas supply source 12, a silicon (Si) supply source 13, and an oxygen supply source 14. A nitrogen gas $N_2$ can be used as the carrier gas, a monosilance $SiH_4$ can be used as the silicon supply source 13, and a nitrous oxide $N_2O$, a nitrogen monoxide $NO$ or a nitrogen dioxide $NO_2$ can be used as the oxygen supply source 14.

With such an arrangement, the gases from these supply sources 12, 13 and 14 are mixed together and supplied into the reaction furnace 11. On the other hand, a substrate 1 to be formed thereon with the polycrystalline silicon layer 9 is disposed in the reaction furnace 11 and this substrate 1 is heated at a temperature of 600° C to 750° C, for example, 650° C. Thus, the monosilance $SiH_4$ and the nitrogen oxide $N_2O$, NO or $NO_2$ are made to react with each other to form the polycrystalline silicon layer 9 containing oxygen on the surface of the substrate 1. Reference numerals 15, 16 and 17 designate valves provided between the respective supply sources 12, 13 and 14 and the reaction furnace 11 for adjusting or shutting-off the supply amount of each gas.

The reason why the monosilance $SiH_4$ is used as the silicon supply source is that it can produce a desired, relatively fine polycrystalline silicon layer, that is, a desired Si polycrystalline layer having small crystal grain size at a relatively low temperature, for example, 650° C. If another silicon supply source, for example, $SiCl_4$ is used, the reaction temperature becomes high such as 900° C, so that the crystal grain becomes large and the leak current is increased. Further, if the nitrogen oxide $N_2O$, $NO$ or $NO_2$ is used as the oxygen supply source 14, the doping amount of oxygen in the produced polycrystalline silicon layer can be easily and reliably controlled. This oxygen doping amount can be controlled by selecting the mixing ratio of $N_2O$, $NO$ or $NO_2$ and $SiH_4$ which are supplied into the reaction furnace 11.

The reason of selecting the temperature of the substrate 1 in a range between 600° C and 750° C as mentioned above is due to the fact that at a temperature lower than 600° C the growth rate of a polycrystalline silicon layer is slow and its productivity is low, while at a temperature higher than 750° C the growth rate of a polycrystalline silicon layer is contrarily too fast so that it becomes difficult to control the thickness of the polycrystalline silicon layer and the crystal grain size of the produced polycrystalline silicon layer becomes large.

For producing a nitrogen-doped polycrystalline silicon layer 10 on the oxygen-doped polycrystalline silicon layer 9 formed as mentioned above, a nitrogen supply source 18, for example, a $NH_3$ supply source is connected to the reaction furnace 11 through an adjusting and opening-closing valve 19. During a time period when the above-mentioned oxygen-doped polycrystalline silicon layer 9 is produced, the valve 19 is closed to stop the supply of $NH_3$ and the oxygen-doped silicon layer 9 is produced. Thereafter, the valve 17 is closed and the valve 19 is opened to produce the nitrogen-doped polycrystalline layer 10 on the layer 9. Thus, these oxygen-doped and nitrogen-doped polycrystalline silicon layers 9 and 10 can be simply formed by a successive operation.

With the above mentioned Schottky barrier diode according to this invention, it is ascertained that the oxygen-doped polycrystalline silicon layer 9 is deposited on the surface of the substrate 1 in contact with and outwardly extending from the periphery of the Schottky barrier 3, in this example the peripheral edge 3a thereof so that the breakdown at the peripheral edge 3a may be effectively prevented to improve the withstanding voltage. The above fact is considered to be caused by the following phenomenon. That is, since many traps existing in the polycrystal silicon layer 9 catch a great number of carriers in the substrate 1 or the semiconductor silicon layer 5, that is, electrons in the illustrated example, a very thin substrate surface region under the layer 9 is made as a depletion layer as shown by chain lines $a'$ in FIG. 4. This depletion layer $a'$ is connected to the depletion layer $a$ at the peripheral edge 3a of the Schottky barrier 3 to avoid the field concentration at this portion.

Figure 7:
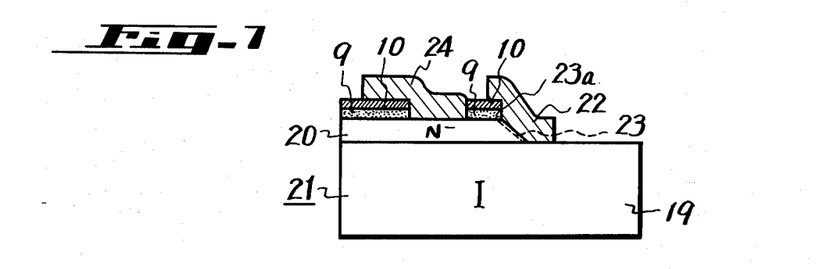
FIGS. 7 to 9 are enlarged cross-sectional views respectively showing one example of the device of this invention.

FIG. 7 shows another example of the Schottky barrier diode according to this invention. In this example, an insulating or semi-insulating, for example, intrinsic substrate 19 consisting of GaAs product is formed thereon with an N-type Ga As product semiconductor layer 20 having impurity concentration of about $1 \times 10^{17}$ to $3 \times 10^{17}$ cm$^{-3}$ at a thickness of 1 to 3 $\mu$ in an epitaxial growth manner thereby to form a semiconductor substrate 21. The semiconductor layer 20 is partially removed by selective etching process to deposit at its end surface a metal contact 22 such as Al or Cr-An alloy, thus a Schottky barrier 23 being formed. Then, the semiconductor layer 20 is deposited on its other portion with the other metal contact 24 consisting of Au-Ge alloy or Ag-In alloy in an ohmic contact therewith. In this case, the semiconductor layer 20 is deposited thereon with the oxygen-doped polycrystalline silicon layer 9 as the protecting layer for passivation as shown in FIG. 4, on which is similarly deposited the nitrogen-doped insulating layer 10 by way of example. In the Schottky barrier diode of FIG. 7, the side of the semiconductor layer 20 is utilized so that a diode of small area can be produced.

With the Schottky barrier diode constructed as mentioned above, the breakdown at the end edge 23a of the Schottky barrier 23 extending to the surface of the semiconductor layer 20 can also be effectively prevented.

Further, this invention can be applied not only to the Schottky barrier diode but also to another Schottky barrier type semiconductor device, for example, a Schottky barrier collector type transistor in which the collector junction is formed by the Schottky barrier to achieve the same effect. One example of the above case will next be described with reference to FIG. 8.

Figure 8:
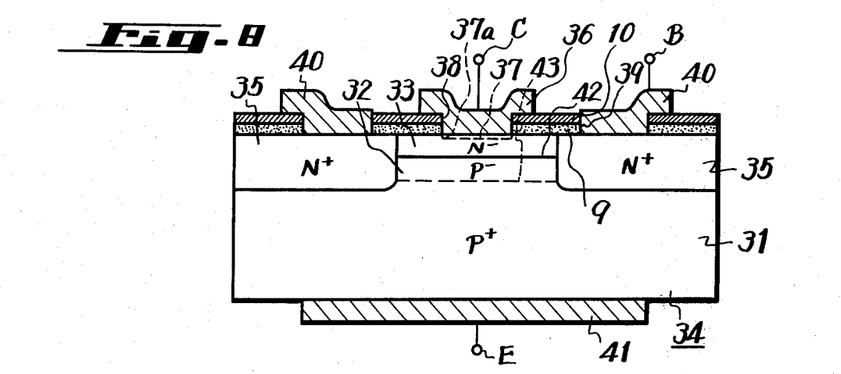

In this example, there is provided an original P-type semiconductor silicon substrate 31 with high impurity concentration in an order of, for example, $10^{20}$cm$^{-3}$, then there is formed thereon by epitaxial growth a semiconductor silicon layer 32 which is similarly P-type but sufficiently low in concentration as compared with the original substrate 31, for example, $5 \times 10^{16}$cm$^{-3}$, and then there is further formed thereon by epitaxial growth an N-type semiconductor silicon layer 33 with low concentration similarly, thus a semiconductor substrate 34 being formed. Then, impurities are selectively diffused into the semiconductor substrate 34 from its surface including the semiconductor layer 33 so that its surface concentration may become, for example, $10^{20}$cm$^{-3}$ to form an annular base electrode contact region 35 having high concentration and the same conductivity type as that of the semiconductor layer 33 about one part of the semiconductor layer 33 with a depth enough for reaching the original substrate 31 through the semiconductor layers 33 and 32. The above diffusion is carried out in such a manner that the substrate 34 is formed on its surface with a diffusion mask such as $SiO_2$, though not shown, which is subjected to photo-etching process to form a diffusion window and through this window impurities are diffused. After the region 35 is formed, the $SiO_2$ layer used as the iffusion mask is removed by etching and then the oxygen-doped polycrystalline silicon layer 9 and the nitrogen-doped polycrystalline silicon layer 10 are sequentially formed on the surface of the substrate 34 by the CVD method in the same manner as described previously. Thereafter, the layers 10 and 9 on the semiconductor layer 33 at its portion encircled by the region 35 and on the region 35 are respectively subjected to photoetching process to provide electrode windows 38 and 39. An electrode metal layer such as aluminum is vaporized all over the surface including the inner portion of these windows 38 and 39 and then an unnecessary portion is removed by photoetching to form a metal contact as a collector electrode 36 which forms a Schottky barrier 37 serving as the collector junction with the semiconductor layer 33 through the window 38 and to deposit a base electrode 40 on the base region 35 in homic contact therewith through the window 39. Further, an emitter electrode 41 is deposited on the original substrate 31 of high concentration.

With the construction as mentioned above, the P-type substrate 31 and the P-type semiconductor layer 32 formed thereon are used as an emitter region, the N-type semiconductor layer 33 is used as a base region, the PN-junction between the semiconductor layers 32 and 33 is used as an emitter junction, and the Schottky barrier 37 is used as a collector junction, thus a transistor being formed.

With the transistor constructed as mentioned above, the peripheral edge 37a of the Schottky barrier 37 is covered by the oxygen-doped polycrystalline silicon layer 9 so that its breakdown can be effectively prevented even in this case and its withstanding voltage can be enhanced.

Such a transistor having the collector junction of the Schottky barrier has an advantage that the switching characteristics are excellent, the frequency characteristics can be improved and further its fabricating process is simplified. That is, for producing the transistor of this kind, as mentioned above the photoetching process or an exposure mask matching process following thereto is composed of only three processes including the photoetching process of diffusion window opening to, for example, the $SiO_2$ layer for the selective diffusion of the region 35, the photoetching process for boring the electrode windows 38 and 39 through the layers 10 and 9, and the photoetching process for patternning the aluminum metal layer as the electrodes 36 and 40.

With the above mentioned transistor, a lightly doped and heavily doped junction (hereinafter referred to as L-H junction) 43 formed in the emitter region between the heavily doped substrate 31 and the lightly doped semiconductor layer 32 is located opposing to the emitter junction 42. Therefore, if a distance between the junctions 42 and 43 is selected smaller than the diffusion length of minority carriers in the semiconductor layer 32, carriers or electrons injected from the base region into the emitter region are pushed back by the L-H junction 43 so that electric current due to electrons can be reduced and high emitter-grounded current amplification factor $h_{FE}$ can be obtained. With the above construction, however, if a reverse transistor, that is, a transistor with the electrode 36 being used as the emitter electrode and the electrode 41 as the collector electrode in FIG. 8 is considered, its emitter junction will be formed by the Schottky barrier. Since no carrier is injected at the Schottky barrier, the factor $h_{FE}$ of this reverse transistor is almost zero. In other words, the above mentioned one is utilized as an asymmetric transistor.

Figure 9:
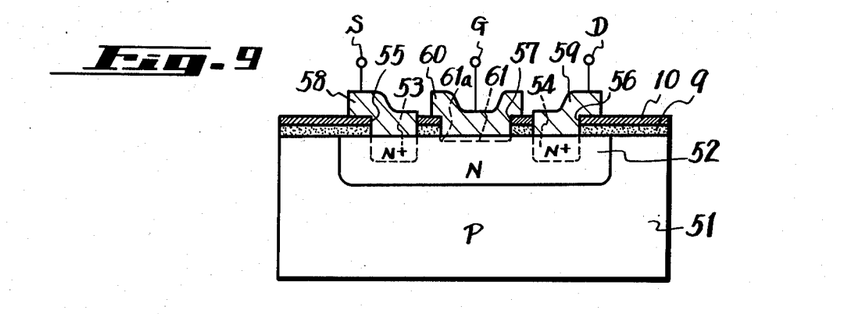

FIG. 9 shows one example of a Schottky barrier gated field effect transistor according to this invention. In this example, a P-type silicon semiconductor substrate 51 is provided thereon at its one portion with an N-type semiconductor region 52 of low impurity concentration in which source and drain regions 53 and 54 are respectively formed. On the surface of the substrate 51 having the region 52 there are successively deposited the oxygen-doped and nitrogen-doped polycrystalline silicon layers 9 and 10 by the CVD method similarly as mentioned previously. These layers 9 and 10 are provided therethrough with source, drain and gate electrode windows 55, 56 and 57 respectively at their portions on the source and drain regions 53 and 54 and between the regions 53 and 54. Then, for example, an aluminum electrode metal is deposited over the entire surface including the inside portions of these windows 55, 56 and 57, and thereafter an unnecessary portion is removed by photoetching to form source, drain and gate electrodes 58, 59 and 60. In this case, a Schottky barrier 61 is formed at a portion where the gate electrode 60 is deposited on the N-type lightly doped region 52 through the window 57 to form a Schottky barrier-type gate, while ohmic contacts are formed with portions where the source and drain electrodes 58 and 59 are deposited on the heavily doped source and drain regions 53 and 54 through the windows 55 and 56.

In the field effect transistor as mentioned above, the peripheral edge of the Schottky barrier 61 is similarly covered by the oxygen-doped polycrystalline silicon layer 9, so that the breakdown voltage can be enhanced. Further, the insulating layer 10 is similarly provided on the layer 9 as in the other examples mentioned above.

Further, this invention can be applied to a bipolar transistor in which a base electrode is extended on a collector region to form a Schottky barrier relative to the collector region so that its switching speed, particularly its switching operation at its nonconductive condition may be quickened. At first, a prior art transistor of this kind will be described with reference to FIG. 10. By way of example, on an N-type silicon semiconductor substrate 71 having high impurity concentration there is formed by epitaxial growth a silicon semiconductor layer 72 of the same conductivity type as that of the former and having low impurity concentration to construct a whole semiconductor substrate 73 serving as a collector region. The semiconductor layer 72 of the substrate 73 is provided thereon at its one portion with a P-type base region 74 by selective diffusion and on one portion of this region 74 there is further formed an N-type emitter region 75 by selective diffusion. In this case, the base region 74 is formed in, for example, an annular shape so that one portion 72a of the collector region or N-type semiconductor layer 72 may face the portion encircled by this region 74. Then, a base electrode 76 is deposited on the base region 74 extending over the one portion 72a of the collector region so that it forms an ohmic contact with the base region 74 and forms a Schottky barrier 77 with the one portion 72a of the collector region, and all the peripheral edge of the Schottky barrier 77 is surrounded by the base region 74. Reference numeral 78 represents a protective insulating layer for passivation consisting of $SiO_2$ formed on the substrate surface and 79 an emitter electrode.

Figure 10:
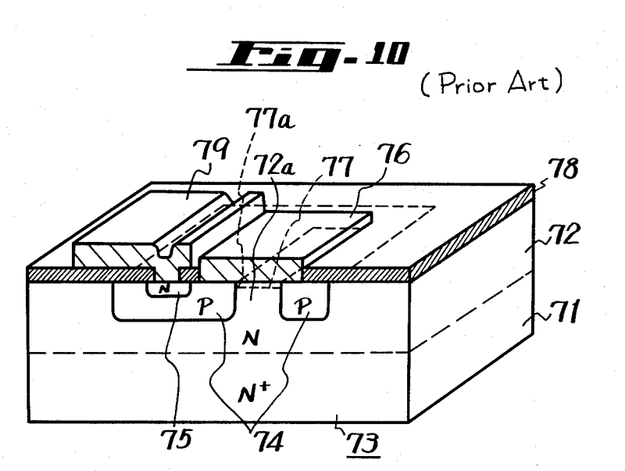
FIG. 10 is an enlarged perspective view, with partial section, of a prior art transistor.

In the transistor as described above, since the base electrode 76 is formed on the collector region through the Schottky barrier 77, during the OFF time period of the transistor the minority carriers stored in its collector region can be effectively removed so that its OFF characteristic curve is made sharp and its switching speed can be effectively quickened. Also, since the peripheral edge 77a of the Schottky barrier 77 is surrounded by the base region 74, this region performs the same effect as the guard-ring region mentioned in FIG. 2 so that the withstanding voltage of the Schottky barrier 77 can be effectively enhanced.

With the above mentioned construction, however, since the whole peripheral edge of the Schottky barrier 77 is surrounded by the base region 74, the total area is relatively increased. Particularly, when such a transistor is intended to be used as a circuit element of a semiconductor integrated circuit, the total area becomes large to obstruct the dense construction of the integrated circuit.

According to this invention, the drawbacks as described above can be eliminated. One example of this invention for use in the integrated circuit will below be described with reference to FIG. 11. In this case, for example, a P-type silicon semiconductor substrate 81 is formed thereon with an N-type silicon semiconductor layer 82 by epitaxial growth process to form a whole semiconductor substrate 83 for integrated circuit. The semiconductor layer 82 is selectively diffused to form a P-type isolation region with a depth reaching the substrate 81 and the semiconductor layer 82 is separated into a plurality of portions 82A, 82B, 82C, . . . by the above isolation region 84 and the original substrate 81. A transistor is constructed, for example, in one portion 82B by the following manner.

Figure 11:
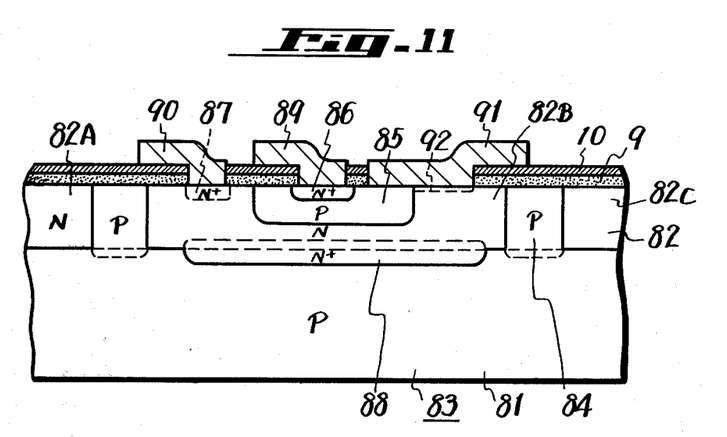
FIG. 11 is an enlarged cross-sectional view showing another example of the device of this invention.

With the portion 82B of the semiconductor layer 82 being used as a collector region, a P-type base region 85 is selectively diffused on its one portion and further an N-type emitter region 86 of relatively high impurity concentration is diffused on one portion of the base region 85. At the same time as the diffusion of this region 86, a collector electrode contact region 87 of high impurity concentration is formed in the collector region or the N-type portion 82B. Under the portion 82B an N-type collector burried region 88 of high impurity concentration is formed in advance before the epitaxial growth of the semiconductor layer 82. In this invention, the oxygen-doped polycrystalline silicon layer 9 and the nitrogen-doped polycrystalline silicon layer 10 are continuously deposited by the CVD method on the surface of the semiconductor substrate 83 in the same manner as mentioned previously. These layers 10 and 9 are provided therethrough with an emitter electrode window and a collector electrode window, respectively, on the emitter region 86 and the collector electrode contact region 87, and also with a base electrode window extending over the base region 85 and N-type low concentration semiconductor portion 82B of the collector region. Then, emitter, collector and base electrodes 89, 90 and 91 made of, for example, aluminum are respectively deposited through each electrode window. In this case, the electrodes 89 and 90 are deposited in ohmic contact with the emitter region 86 and the collector electrode contact region 87 each having relatively high impurity concentration. The base electrode 91 is also deposited in ohmic contact with the base region 85, but the base electrode 91 is also deposited on the N-type collector region having relatively low concentration to form a Schottky barrier 92 therewith. In the transistor thus formed on the semiconductor substrate 83, since its base electrode 91 is formed over the collector region through the Schottky barrier 92, similarly as the transistor shown in FIG. 10 there is particularly an effect to increase the switching speed at its OFF state. Further, the peripheral edge of the Schottky barrier 92 is encircled by the base region 85 and the oxygen-doped polycrystalline silicon layer 9, so that its breakdown can be avoided and a high withstanding voltage can be obtained.

According to the device of this invention as described above, it is not necessary to encircle the whole peripheral edge of the Schottky barrier 92, so that the area occupied by the base region can be minimized and hence the total area of this transistor portion can be reduced. As a result, there is an advantage that the highly dense construction of the integrated circuit can be obtained.

According to this invention as mentioned above, in various types of Schottky barrier type semiconductor devices, the oxygen-doped polycrystalline silicon layer is used as its protecting film for passivation to obtain an effect of preventing the breakdown at the peripheral edge of the Schottky barrier. Therefore, the complicated works such as to provide the guard-ring region or to provide the tapered portion at the $SiO_2$ insulating layer as the protecting film for passivation as described in FIGS. 2 and 3 can be avoided. As a result, its construction is simplified and its fabrication is made easy, so that a great advantage can be obtained in its practical use.

In general, when the nitrogen-doped polycrystalline silicon layer 10 is directly deposited on the semiconductor substrate, this nitrogen-doped polycrystalline silicon layer exhibits similar characteristics as the silicon nitride $Si_3N_4$ as previously mentioned. Therefore, when the above layer is directly deposited on the semiconductor substrate, a distortion such as known in $Si_3N_4$ occurs at its boundary surface to extremely lower its characteristics. However, when the oxygen-doped polycrystalline silicon layer 9 is directly deposited on the semiconductor substrate and further the above mentioned layer 10 is deposited thereon through the layer 9 as seen in this invention, such a defect will not be produced.

In the above described examples, the nitrogen-doped polycrystalline silicon layer 10 is formed on the oxygen-doped polycrystalline silicon layer 9. However, in place of the above layer 10 or on this layer 10 there can be deposited an insulating layer such as $SiO_2$.

In the above mentioned examples, the oxygen-doped polycrystalline silicon layer 9 is deposited at the circumference of the Schottky barrier in contact with its peripheral edge. In this case, this layer 9 can also be arranged at a position separated slightly from the peripheral edge of the Schottky barrier, and with the above arrangement, the breakdown at this peripheral edge can also be prevented. That is, in this case, the positional relation between the oxygen-doped polycrystalline silicon layer 9 and the Schottky barrier is selected so that the depletion layer from its peripheral edge may be connected to the depletion layer under the layer 9 before the breakdown at its peripheral edge occurs, that is, at a voltage lower than its breakdown voltage.

Further, in the above described examples, the oxygen-doped polycrystalline silicon layer 9 is produced by the CVD method, but the above oxygen doping can also be performed by an ion injection method or the like.

The present invention is not limited to the illustrated examples but can be applied to another semiconductor devices having Schottky barrier.

In addition, the conductivity types in the respective elements employed in the above examples can be reversed with the same effect.

It will be apparent that many modifications and variations may be effected without departing from the scope of the novel concepts of this invention.

I claim as my invention:

1. A Schottky barrier type semiconductor device comprising: a semiconductor substrate having a predetermined impurity concentration, an electrode formed on said semiconductor substrate in ohmic contact therewith, a metal contact on a surface of said substrate which forms a Schottky barrier with said semiconductor substrate, and a polycrystalline silicon layer containing oxygen atoms in the range between 2 and 45 atomic percent on said surface of said substrate; said polycrystalline silicon layer extending on said surface at least up to the corner which the peripheral portion of said metal contact makes with said surface of said substrate whereby said surface of said semiconductor substrate is stabilized, and the breakdown of said barrier is prevented.

2. A Schottky barrier type semiconductor device according to claim 1, further comprising an insulating layer formed on said polycrystalline silicon layer.

3. A Schottky barrier type semiconductor device according to claim 1, in which said semiconductor substrate is formed on an insulating substrate and said metal contact is formed at a side portion of said semiconductor substrate extending on said insulating substrate.

4. A semiconductor device including a Schottky barrier therein comprising: an emitter region, a base region forming a first PN junction with said emitter region, a collector region forming a second PN junction with said base region, a metal contact forming a Schottky barrier with said collector region and also forming an ohmic contact with said base region; said contact contacting a part of said second PN junction, a polycrystalline silicon layer containing oxygen atoms in the range between 2 and 45 atomic percent; said polycrystalline silicon layer covering said substrate at least up to the corner where the peripheral portion of said metal contact abuts a surface of said base region, said collector region and a part of said second PN junction, thereby to stabilize these portions and to prevent said barrier from breakdown at said peripheral edge, an emitter electrode in contact with said emitter region, said metal electrode including a portion which serves as the base electrode, and a collector electrode in contact with said collector region.

5. A semiconductor device including a Schottky barrier therein comprising: a semiconductor body, an emitter region of one conductivity type in said body, a base region of the opposite conductivity type in said body forming a PN junction with said emitter region, a metal contact on said body forming a Schottky barrier with said base region, a polycrystalline silicon layer containing oxygen atoms in the range between 2 and 45 atomic percent on said body and formed at the peripheral portion of said metal contact covering directly said PN junction between said emitter and base regions to stabilize the surface thereof; said polycrystalline layer contacting the peripheral edge of said Schottky barrier to prevent said barrier from breakdown at the edge portion, an emitter electrode in contact with said emitter region, a base electrode in contact with said base region, the collector electrode being said metal contact.

* * * * *